United States Patent [19]
Lee et al.

[11] Patent Number: 5,450,312
[45] Date of Patent: Sep. 12, 1995

[54] AUTOMATIC TIMBRE CONTROL METHOD AND APPARATUS

[75] Inventors: Won-woo Lee; Yang-rak Kim, both of Seoul, Rep. of Korea

[73] Assignee: Samsung Electronics Co., Ltd., Kyungki-do, Rep. of Korea

[21] Appl. No.: 268,443

[22] Filed: Jun. 30, 1994

[30] Foreign Application Priority Data

Jun. 30, 1993 [KR] Rep. of Korea ............... 93-12404

[51] Int. Cl.⁶ ............................................. G05B 15/00
[52] U.S. Cl. ................................. 364/130; 381/103; 369/32; 369/33
[58] Field of Search ............... 364/130, 724.2; 369/32, 369/47, 34, 50, 41, 36, 59, 37, 33, 38, 39; 360/46, 77, 45, 65, 67; 455/186.2, 233; 381/103

[56] References Cited

U.S. PATENT DOCUMENTS

| | | | |
|---|---|---|---|
| 4,371,901 | 2/1983 | Shah | 360/65 |
| 4,405,836 | 9/1983 | Meyerhoff | 179/1 D |
| 4,458,362 | 7/1984 | Berkovitz et al. | 381/103 |
| 4,761,692 | 8/1988 | Yoshida et al. | 358/335 |
| 4,841,506 | 6/1989 | Kiyoura et al. | 369/32 |
| 5,241,696 | 8/1993 | Mori et al. | 455/186.2 |
| 5,270,875 | 12/1993 | Shah et al. | 360/46 |

Primary Examiner—James P. Trammell
Attorney, Agent, or Firm—Sughrue, Mion, Zinn, Macpeak & Seas

[57] ABSTRACT

An automatic timbre control method and apparatus detect a sub-code representing a music pattern from a signal reproduced from a compact disc, analyze the music pattern depending on the sub-code in a microcomputer, read out a timbre mode coefficient from a coefficient ROM table depending on the analyzed music pattern, and apply the timbre mode coefficient to a digital equalizer so that equalizing can be controlled automatically. Thus, users need not frequently operate an equalizer depending on the input music pattern, and are able to listen music with better timbre quality.

5 Claims, 5 Drawing Sheets

FIG. 3A
| SUB-CODE | TIMBRE MODE |
|---|---|
| 000 | CLASSICAL |
| 001 | POP |
| 010 | JAZZ |
| 011 | HEAVY METAL |
| 100 | SOFT |
| 101 | ROCK |
| 110 | LIVE |
| 111 | PASS |
FIG. 3B
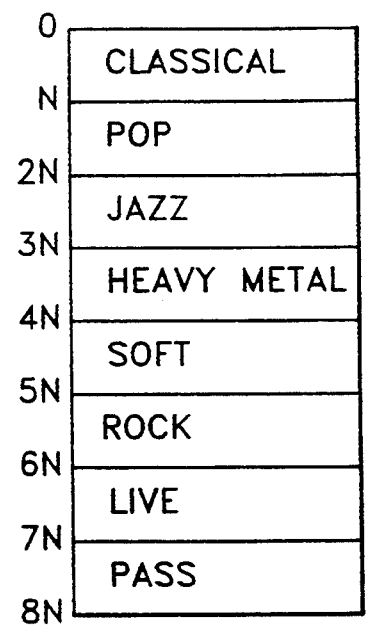
FIG. 4
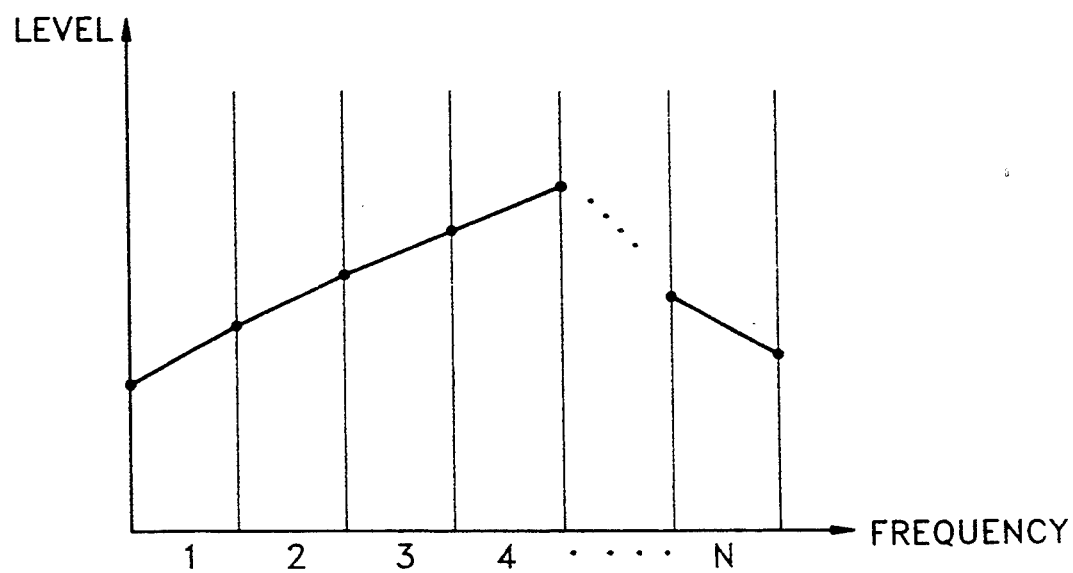

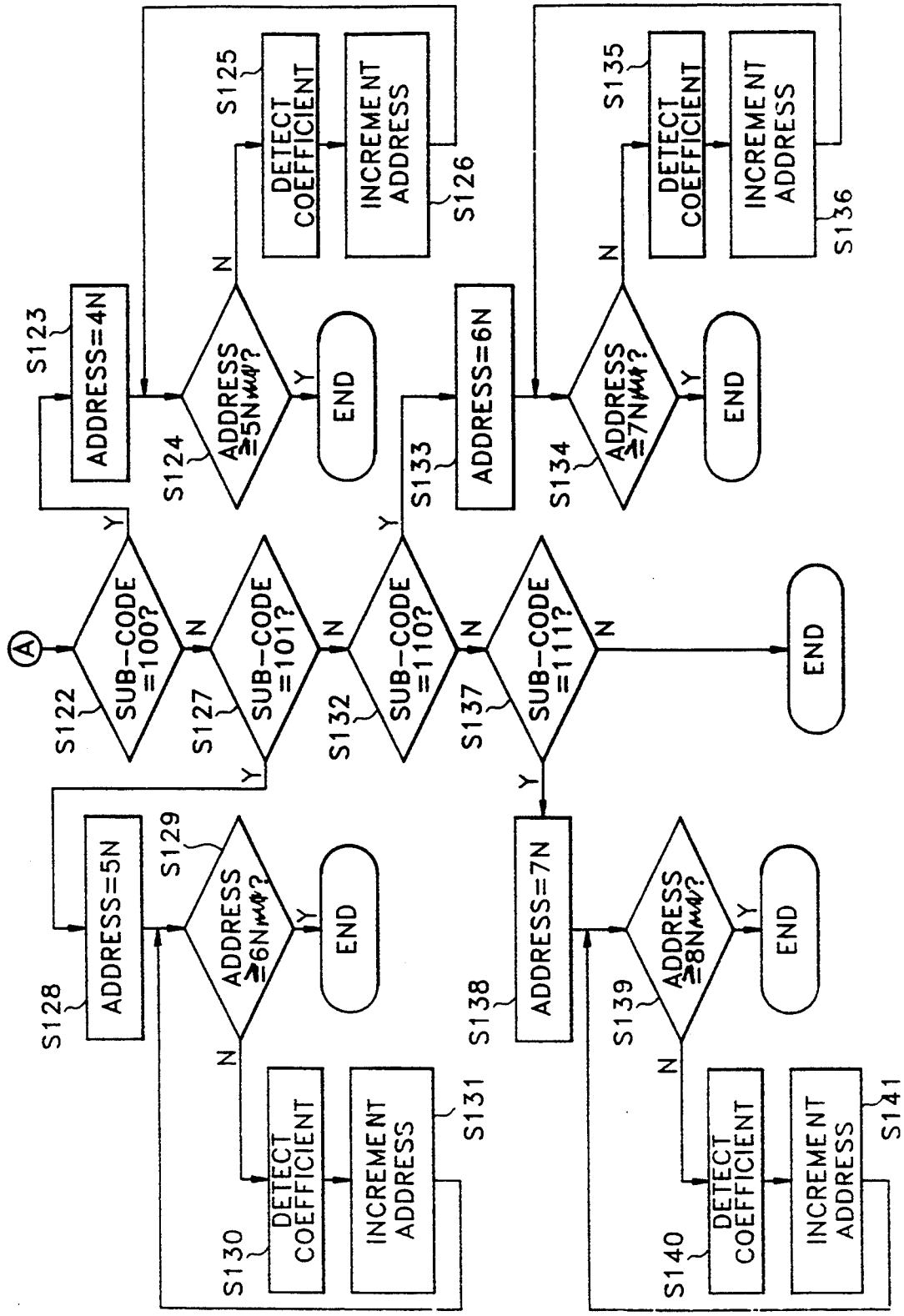

AUTOMATIC TIMBRE CONTROL METHOD AND APPARATUS

BACKGROUND OF THE INVENTION

The present invention relates to an automatic timbre control method and apparatus, and more particularly, to an automatic timbre control method and apparatus which enable automatic timbre control according to a sub-code of the input audio signal, which is assigned a specific code for determining an equalizing mode, by performing a code analysis of the sub-code so as to control a digital equalizer via a microcomputer.

Generally, users determine an audio signal timbre by controlling an equalizer attached to each piece of audio equipment according to the input audio signal. Accordingly, timbre control is performed externally for an audio timbre control apparatus. That is, in the conventional equalizer, external controls are provided in accordance with a plurality of frequency band units, and the user manipulates a control panel of the equalizer so that the desired timbre can be output.

FIG. 1 is a block diagram showing a conventional timbre control apparatus. The apparatus shown in FIG. 1 comprises a compact disc exclusive-use display integration circuit (CD IC) 20, connected to a digital signal input terminal 10, for classifying the audio data and the sub-code from the digital audio signal input via the digital signal input terminal 10, a microcomputer 30, connected to the CD IC 20, for controlling a time checking and CD graphics output determined from the sub-code output from the CD IC 20, a digital equalizer 50, connected to the CD IC 20, for equalizing the audio signal output from the CD IC 20, and a digital-to-analog converter 60, connected to the digital equalizer 50, for converting an equalized digital audio signal output from the digital equalizer 50 into an analog audio signal and for outputting the converted signal via an analog signal output terminal 70.

The operation of the apparatus shown in FIG. 1 will be explained as follows.

A digital audio signal generated from a compact disc is input into the CD IC 20 via the digital signal input terminal 10. The CD IC 20 classifies the input digital audio signal into audio data and a sub-code. The audio data is then supplied to the digital equalizer 50, while the sub-code is supplied to the microcomputer 30. The sub-code is a code that is generally used by the microcomputer 30 as data for time checking or as data used for performing a CD graphics function, e.g., recording information representing words or title of a song.

The digital equalizer 50 divides the audio frequency bands into N bands. A control switch (not shown) is attached to the equalizer 50 so that equalization control can be performed according to the frequency band. In this manner, users adjust timbres by audio frequency band by manipulating the control switch.

The digital equalizer 50, to which the audio data is supplied via the CD IC 20, equalizes the audio data over the frequency bands according to user operation, and outputs the result to the digital-to-analog converter 60.

The digital-to-analog converter 60 converts the digital audio signal equalized by the digital equalizer 50 into an analog audio signal, and outputs the result via the analog signal output terminal 70.

In the conventional timbre control apparatus, a user frequently manipulates the digital equalizer according to the input music pattern so as to determine the timbre. Moreover, a user unfamiliar with the manipulation of a digital equalizer may listen to all music with one setting, or the quality of the music may be reduced due to unskilled equalizing manipulation.

SUMMARY OF THE INVENTION

It is an object of the present invention to provide an automatic timbre control method which automatically controls the timbre of an input audio signal in an audio reproducing system.

It is another object of the present invention to provide an automatic timbre control apparatus which automatically controls a digital equalizer to output the correct timbre of an input audio signal.

To accomplish the above objects, there is provided a method for automatically controlling an audio timbre reproduced from a compact disc, where a code representing a music pattern is assigned to a sub-code recorded onto a predetermined location of the compact disk, in an audio system including a coefficient ROM table where a timbre mode coefficient corresponding to at least one reference music pattern is stored, the method comprising the steps of:

determining a music pattern of an audio signal reproduced from the compact disc by the sub-code;

reading out a timbre mode coefficient corresponding to the determined music pattern from the coefficient ROM table; and controlling a timbre by automatically controlling the level of each frequency band where the audio signal exists according to the timbre mode coefficient.

To accomplish another object of the present invention, there is provided an apparatus for automatically controlling an audio timbre reproduced from a compact disc where a code representing a music pattern is assigned to a sub-code recorded on a predetermined location of the compact disk, the apparatus comprising:

a coefficient ROM table for storing a timbre mode coefficient corresponding to at least one reference music pattern;

classifying means for classifying an audio signal and a sub-code from the signal reproduced from the compact disc;

a digital equalizer for equalizing, according to frequency band, an audio signal classified by the classifying means in accordance with an input timbre mode coefficient; and a microcomputer for determining the music pattern of an audio signal reproduced from the compact disc depending on the sub-code classified by the classifying means, for reading out a timbre mode coefficient corresponding to the determined music pattern from the coefficient ROM table, and for supplying the timbre mode coefficient to the digital equalizer.

BRIEF DESCRIPTION OF THE DRAWINGS

The above objects and advantages of the present invention will become more apparent by describing in detail a preferred embodiment of the invention with reference to the attached drawings in which:

FIG. 3A illustrates a sub-code recorded onto the compact disc, and FIG. 3B illustrates a timbre mode stored in the coefficient ROM table shown in FIG. 2;

FIG. 4 is a graphical representation illustrating an audio signal waveform input via a digital signal input terminal;

FIGS. 5A and 5B are flowcharts illustrating an embodiment of an automatic timbre control method according to the present invention.

DETAILED DESCRIPTION OF THE INVENTION

The present invention will be explained in more detail, with reference to the attached drawings.

Figure 1:
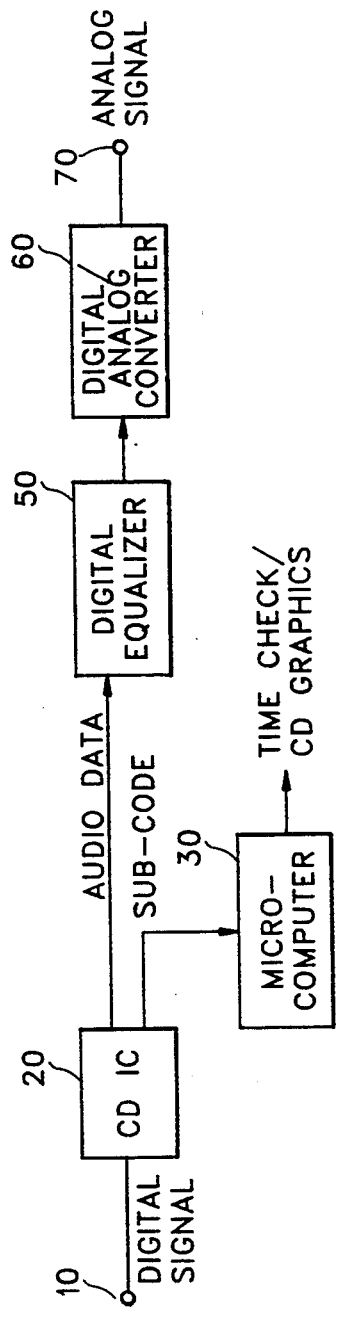
FIG. 1 is a block diagram showing a conventional timbre control apparatus.
Figure 2:
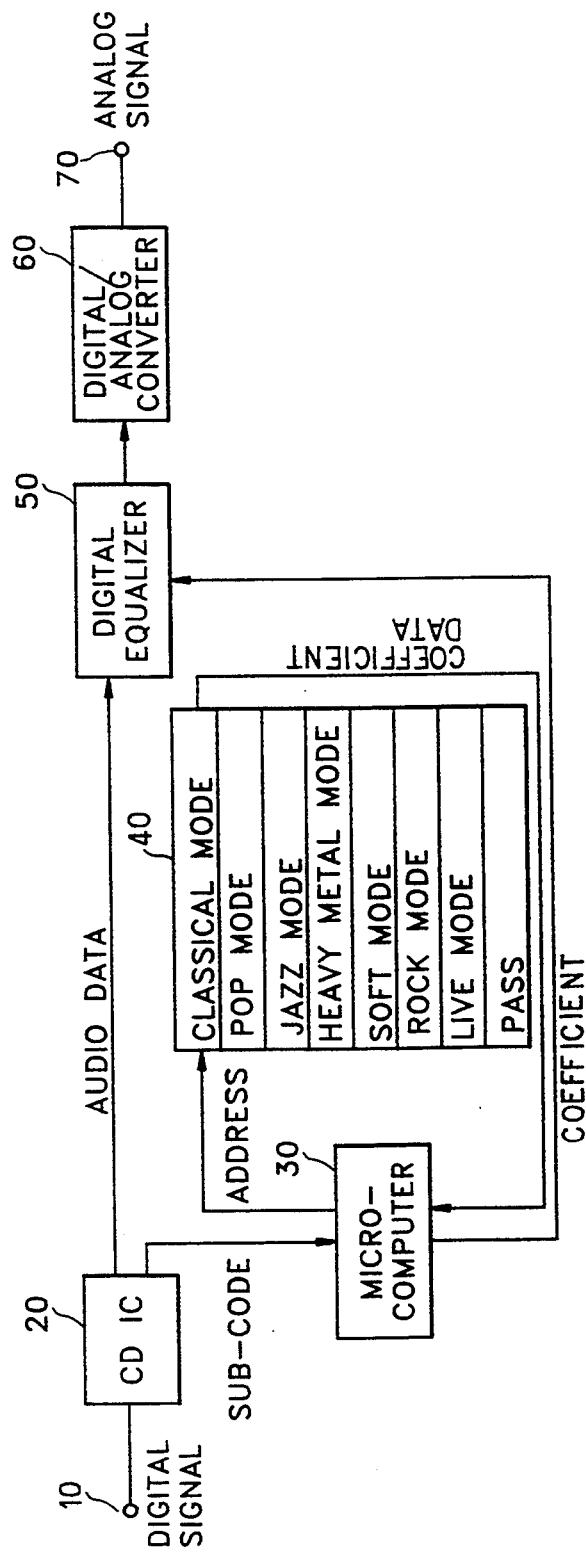
FIG. 2 is a block diagram showing an embodiment of an automatic timbre control apparatus according to the present invention.

Referring to FIG. 2, like components will be labelled with the same reference numerals as in FIG. 1.

The apparatus shown in FIG. 2 comprises a CD IC 20, connected to a digital signal input terminal 10, for classifying the audio data and the sub-code from the digital audio signal input via the digital signal input terminal 10, a microcomputer 30 connected to the CD IC 20 for controlling a time checking and a CD graphics output by detecting the sub-code output from the CD IC 20, a digital equalizer 50 connected to the CD IC 20 for equalizing the audio data output from the CD IC 20, a coefficient ROM table 40 connected to the microcomputer 30 for storing a timbre mode coefficient suitable for a music pattern represented by the sub-code detected by the microcomputer 30, and a digital-to-analog converter 60 connected to the digital equalizer 50 for converting an equalized digital audio signal output from the digital equalizer 50 into an analog audio signal, and for outputting the converted signal via an analog signal output terminal 70.

The operation of the apparatus shown in FIG. 2 will be explained as follows.

A digital audio signal reproduced from a compact disc includes audio data and a sub-code. The digital audio signal input via the digital signal input terminal 10 is supplied to the CD IC 20. The CD IC 20 classifies the input digital audio signal into audio data which is supplied to the digital equalizer 50 and a sub-code which is supplied to the microcomputer 30.

The microcomputer 30 detects a music pattern by decoding the sub-code detected by the CD IC 20. The microcomputer 30 generates an address signal corresponding to a timbre mode coefficient stored in the coefficient ROM table 40. The microcomputer 30 retrieves the timbre mode coefficient from the coefficient ROM table 40 based upon the generated address and outputs the result to the digital equalizer 50. The microcomputer 30 includes a decoder for decoding the sub-code reproduced from the compact disc so that a music pattern can be discriminated from the sub-code classified by the CD IC 20.

The digital equalizer 50 equalizes the audio data output from the CD IC 20 according to the timbre mode coefficient output from the microcomputer 30.

The digital-to-analog converter 60 converts the digital audio signal equalized by the digital equalizer 50 into an analog audio signal, and outputs the result via the analog signal output terminal 70.

FIG. 3A illustrates a sub-code recorded onto the compact disc, and FIG. 3B illustrates a timbre mode stored in the coefficient ROM table 40 shown in FIG. 2.

A graphical representation of an audio signal waveform input via the digital signal input terminal 10 is illustrated in FIG. 4.

For the sub-code shown in FIG. 3A, if eight timbre modes are necessary, it is sufficient to allocate a $\log_2 8$-bit code (three bits) as the sub-code. For example, if a sub-code of a specific music pattern results in zero, the microcomputer 30 analyzes the sub-code and determines that the sub-code corresponds to classical music. Thus, the microcomputer 30 generates an address corresponding to the classical mode of the coefficient ROM table 40.

The coefficient ROM table 40 receives an address signal from the microcomputer 30, and outputs a coefficient corresponding to the classical mode stored in the relevant address to the microcomputer 30. The coefficient is supplied to the digital equalizer 50 from the microcomputer 30. The digital equalizer 50 is automatically controlled such that the equalizing state satisfies the coefficient.

In addition, each coefficient, i.e., for the N frequency bands, is stored in the coefficient ROM table 40, as shown in FIG. 4.

Figure 5A:
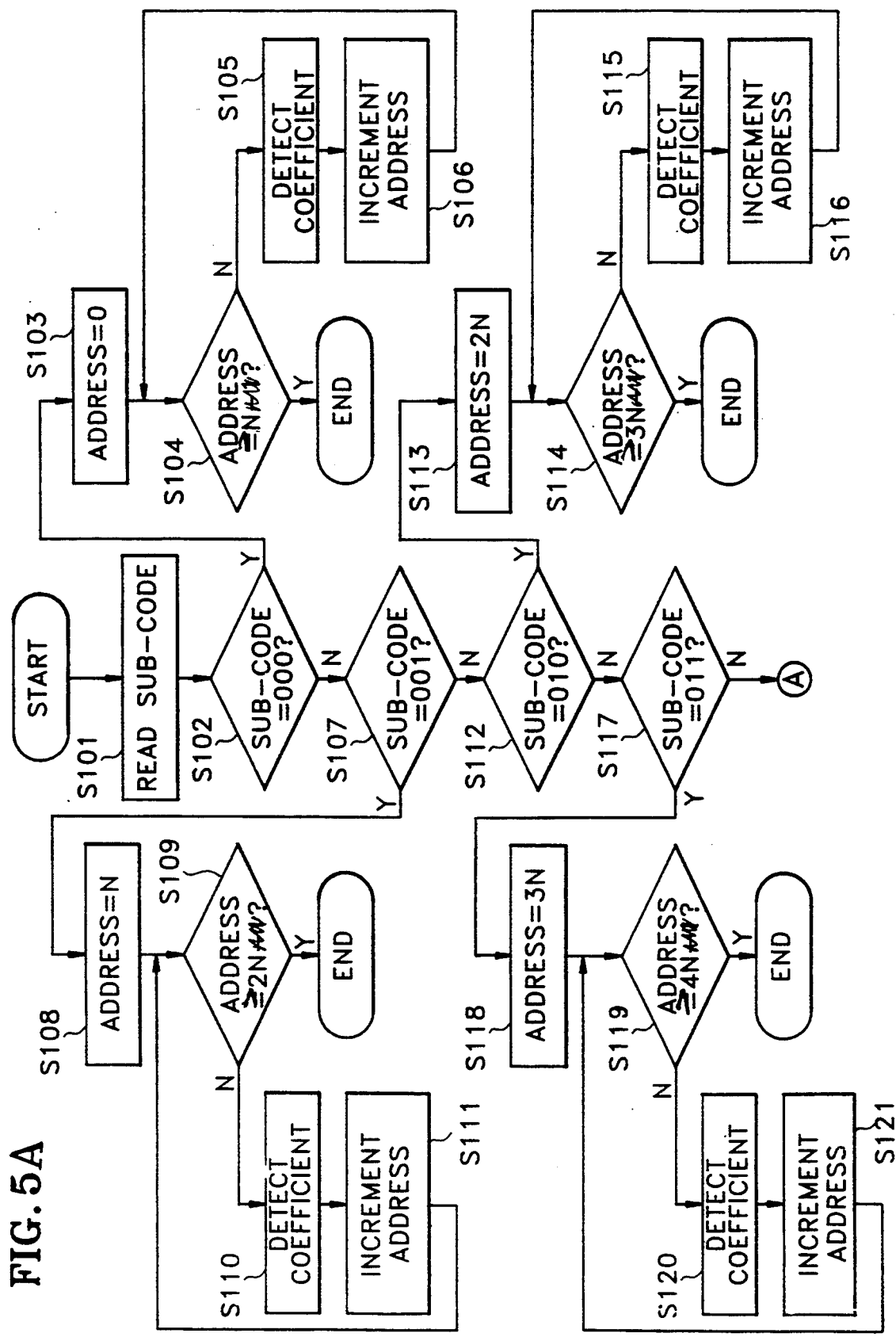

FIGS. 5A and 5B are flowcharts illustrating an embodiment of the automatic timbre control method according to the present invention.

Referring to FIGS. 3A, 3B, 5A and 5B, the operation of the microcomputer 30 will be explained as follows.

The sub-code detected by the CD IC 20 is read by the microcomputer 30 in step S101.

In step S102, it is determined whether the sub-code read in step S101 is "000", and if it is, the address for the first timbre mode of the coefficient ROM table 40 is set as "0" in step S103.

In step S104, it is determined whether the address is at least equal to N. If the condition in step S104 is satisfied, the program is terminated. If the address is less than N, a coefficient stored in the coefficient ROM table 40 is detected and supplied to the microcomputer 30 in step S105. In step S106, the address value is incremented by one. The program then returns to step S104.

When the sub-code is not "000" in step S102, step S107 is performed to determine whether the sub-code is "001". When the condition in step S107 is satisfied, step S108 is performed and the address for the second timbre mode from the coefficient ROM table 40 is assigned as N.

In step S109, it is determined whether the address is at least equal to 2N. If the answer is yes, the program is terminated. If the answer is no, a coefficient stored in the coefficient ROM table 40 is detected in step S110 and supplied to the microcomputer 30. In step S111, the address value is incremented by one. The program then returns to step S109.

When the answer to step S107 is no, step S112 is performed to determine whether the sub-code is "010". If the answer to step S112 is yes, the address for the third timbre mode of the coefficient ROM table 40 is assigned as 2N in step S113.

In step S114, it is determined whether the address is at least equal to 3N. If the answer to step S114 is yes, the program is terminated. If the answer in step S114 is no, a coefficient stored in the coefficient ROM table 40 is detected and supplied to the microcomputer 30 in step S115. In step S116, the address value is incremented by one. The program then returns to step S114.

When the sub-code is not "010" in step S112, it is determined whether the sub-code is "011" in step S117

When the sub-code is "011", the address for the fourth timbre mode of the coefficient ROM table 40 is assigned as 3N in step S118.

In step S119, it is determined whether the address is at least equal to 4N. If the answer to step S119 is yes, the program is terminated. If the answer to step S119 is no, a coefficient stored in the coefficient ROM table 40 is detected and supplied to microcomputer 30 in step S120. In step S121, the address value is incremented by one. The program then returns to step S119.

In step S122, it is determined whether the sub-code is "100". Step S123 is performed when the sub-code is "100", so that the address for the fifth timbre mode of the coefficient ROM table 40 is assigned as 4N.

In step S124, it is determined whether the address is at least equal to 5N. If the answer to step S124 is yes, the program is terminated. If the answer to step S124 is no, step S125 is performed and a coefficient stored in the coefficient ROM table 40 is detected and supplied to microcomputer 30. In step S126, the address value is incremented by one. Then, the program returns to step S124.

In step S127, it is determined whether the sub-code is "101". If the sub-code is "101" the address for the sixth timbre mode of the coefficient ROM table 40 is assigned as 5N in step S128.

In step S129, it is determined whether the address is at least equal to 6N. If the answer to step S129 is yes, the program is terminated. If the answer to step S129 is no, a coefficient stored in the coefficient ROM table 40 is detected and supplied to the microcomputer 30 in step S130. In step S131, the address value is incremented by one. Then, the program returns to step S129.

In step S132, it is determined whether the sub-code is "110". In step S133, when the sub-code is "110", the address for the seventh timbre mode of the coefficient ROM table 40 is assigned as 6N.

In step S134, it is determined whether the address is at least equal to 7N. If the answer to step S134 is yes, the program is terminated. If the answer to step S134 is no, a coefficient stored in the coefficient ROM table 40 is detected and supplied to the microcomputer 30 in step S135. In step S136, the address value is incremented by one. Then, the program returns to step S134.

In step S137, it is determined whether the sub-code is "111". In step S138, the address for the eighth timbre mode of the coefficient ROM table 40 is assigned as 7N.

In step S139, it is determined whether the address is at least equal to 8N. If the answer to step S139 is yes, the program is terminated. If the answer to step S139 is no, a coefficient stored in the coefficient ROM table 40 is detected and supplied to the microcomputer 30 in step S140. In step S141, the address value is incremented by one. Then, the program returns to step S139.

Figure 6:
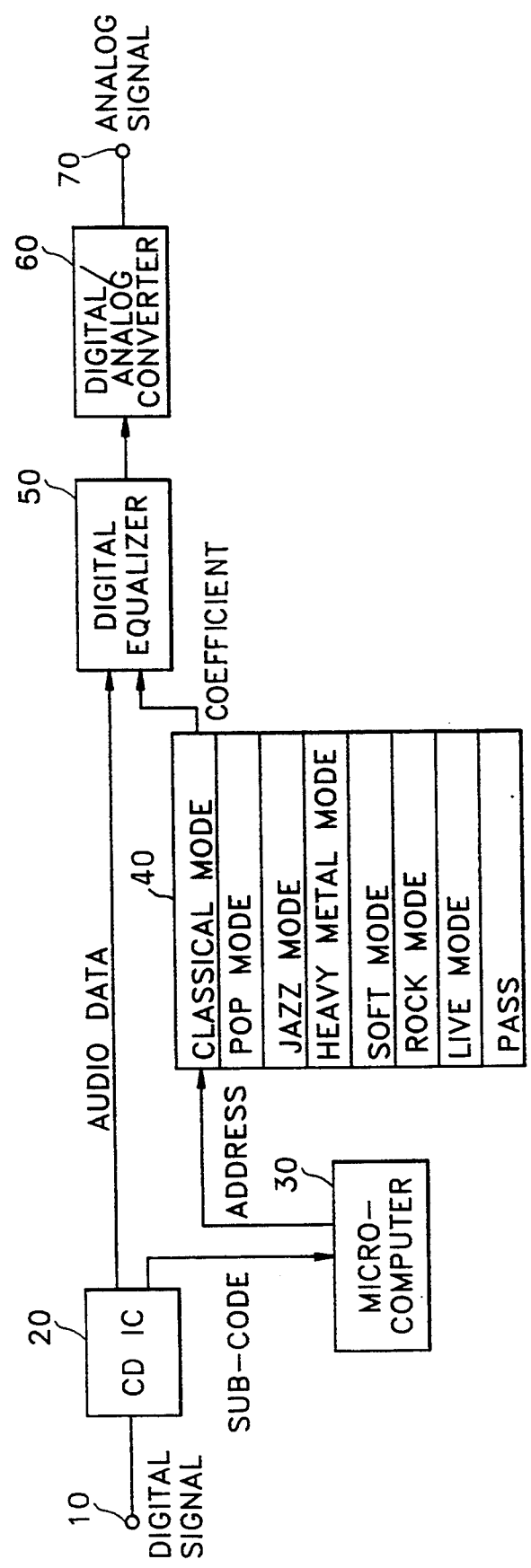
FIG. 6 is a block diagram showing another embodiment of an automatic timbre control apparatus according to the present invention.

FIG. 6 is a block diagram showing another embodiment of an automatic timbre control apparatus according to the present invention. In FIG. 6, the same reference numerals are used to designate those components which are illustrated in FIG. 2. Accordingly, an explanation of these components will be omitted.

The, apparatus shown in FIG. 6 adopts a system where a coefficient is directly supplied to the digital equalizer 50 from the coefficient ROM table 40 when the microcomputer 30 addresses the coefficient stored in the coefficient ROM table 40, while the apparatus shown in FIG. 2 employs a system in which a coefficient stored in the coefficient ROM table 40 is retrieved by the microcomputer 30 and supplied to the digital equalizer 50 via the microcomputer 30.

According to the embodiment illustrated in FIG. 6, a digital audio signal, input via the digital signal input terminal 10, is supplied to the CD IC 20. The CD IC 20 classifies the input digital audio signal into audio data and a sub-code. The sub-code classified and output by the CD IC 20 is supplied to the microcomputer 30.

In the microcomputer 30, a music pattern is determined by decoding the sub-code detected by the CD IC 20, and the appropriate coefficient stored in the coefficient ROM table 40 is retrieved. The microcomputer 30 includes a decoder for decoding the sub-code reproduced from the compact disc so that the music pattern can be discriminated from the sub-code classified by the CD IC 20.

The coefficient ROM table 40 outputs a timbre mode coefficient, depending on the music pattern detected by the microcomputer 30, to the digital equalizer 50.

The equalizing state of the digital equalizer 50 is automatically controlled according to the applied coefficient. The digital audio data equalized by the digital equalizer 50 is converted into an analog audio signal by the digital-to-analog converter 60 which outputs the analog audio signal via the analog signal output terminal 70.

The same results as that of FIG. 2 can be obtained by the above-described operation.

An automatic timbre control method and apparatus detect a sub-code representing a music pattern from a signal reproduced from a compact disc, and a music pattern is detected depending on the sub-code analyzed by a microcomputer. Then, a timbre mode coefficient based on the analyzed music pattern is read out from a coefficient ROM table. The analyzed music pattern is supplied to a digital equalizer so that equalizing can be automatically controlled. Thus, users need not frequently manipulate an equalizer depending on the input music pattern, and the users are able to listen to the music with better timbre quality.

What is claimed is:

1. A method for automatically controlling an audio timbre of an audio signal reproduced from a compact disc, on which a code representing a music pattern is assigned to a sub-code recorded onto a predetermined location of the compact disc, in an audio system including a coefficient ROM table for storing at least one timbre mode coefficient corresponding a reference music pattern, said method comprising the steps of:

determining said music pattern of said audio signal reproduced from said compact disc according to said sub-code;

reading out said at least one timbre mode coefficient corresponding to said music pattern from said coefficient ROM table; and controlling said audio timbre by automatically controlling a level of each frequency band where said audio signal exists according to said at least one timbre mode coefficient.

2. An apparatus for automatically controlling an audio timbre reproduced from a compact disc where a code representing a music pattern is assigned to a sub-code recorded on a predetermined location of said compact disc, said apparatus comprising:

a coefficient ROM table for storing at least one timbre mode coefficient corresponding to a reference music pattern;

classifying means for classifying an audio signal and a sub-code from a signal reproduced from said compact disc;

a digital equalizer for equalizing, according to frequency band, said audio signal classified by said classifying means; and a microcomputer for determining a music pattern of said audio signal reproduced from said compact disc depending on said sub-code classified by said classifying means, for reading out a timbre mode coefficient corresponding to said music pattern from said coefficient ROM table, and for supplying said timbre mode coefficient to said digital equalizer, said digital equalizer equalizing said audio signal in accordance with said timbre mode coefficient.

3. The automatic timbre control apparatus according to claim 2, wherein said timbre mode coefficient stored in said coefficient ROM table is supplied to said digital equalizer via said microcomputer.

4. The automatic timbre control apparatus according to claim 2, wherein said timbre mode coefficient stored in said coefficient ROM table is directly supplied to said digital equalizer from said coefficient ROM table.

5. The automatic timbre control apparatus according to claim 2, wherein said microcomputer includes a decoder for decoding said sub-code reproduced from said compact disc so that said music pattern is discriminated from said sub-code classified by said classifying means.

* * * * *